(12) United States Patent
Raza

(10) Patent No.: US 8,841,650 B2
(45) Date of Patent: Sep. 23, 2014

(54) ELECTRONIC-STRUCTURE MODULATION TRANSISTOR

(75) Inventor: Hassan Raza, Iowa City, IA (US)

(73) Assignee: Cornell University, Ithaca, NY (US)

( * ) Notice: Subject to any disclaimer, the term of this patent is extended or adjusted under 35 U.S.C. 154(b) by 142 days.

(21) Appl. No.: 12/711,007

(22) Filed: Feb. 23, 2010

(65) Prior Publication Data
US 2010/0214012 A1 Aug. 26, 2010

Related U.S. Application Data

(60) Provisional application No. 61/154,678, filed on Feb. 23, 2009.

(51) Int. Cl.
| | |
|---|---|
| H01L 29/06 | (2006.01) |
| H01L 51/05 | (2006.01) |
| H01L 29/775 | (2006.01) |
| H01L 29/778 | (2006.01) |
| H01L 29/16 | (2006.01) |
| B82Y 10/00 | (2011.01) |

(52) U.S. Cl.
CPC .......... *H01L 29/775* (2013.01); *H01L 51/0558* (2013.01); *H01L 51/0595* (2013.01); *H01L 29/778* (2013.01); *H01L 29/1606* (2013.01); *H01L 29/0673* (2013.01); *B82Y 10/00* (2013.01); *Y10S 977/734* (2013.01); *Y10S 977/762* (2013.01)
USPC ................ 257/24; 257/E29.49; 257/E29.264; 438/197; 977/734; 977/762

(58) Field of Classification Search
USPC ............. 257/24, E21.409, E29.264; 438/197; 327/537
See application file for complete search history.

(56) References Cited

U.S. PATENT DOCUMENTS

2009/0315631 A1* 12/2009 Ham et al. .............. 331/117 FE

OTHER PUBLICATIONS

Cresti et al., Charge Transport in Disordered Graphene—Based Low Dimensional Materials, Nano Res (2008) 1:361-394.*
Abstract of Cresti et al., Charge Transport in Disordered Graphene—Based Low Dimensional Materials, Nano Res (2008) 1:361-394.*
Ganguly, U., et al., "Carbon nanotube-based nonvolatile memory with charge storage in metal nanocrystals", *Applied Physics Letters*, 87, (2005), 043108-1-043108-3.
Gledhill, S. E., et al., "Organic and nano-structured composite photovoltaics: An Overview", *J. Mater. Res.*, 20(12), (2005), 3167-3179.
Ismail, P. F., et al., "Quantum Phenomena in Field-Effect-Controlled Semiconductor Nanostructures", *Proceedings of the IEEE*, 79(8), (1991), 1106-1116.
Lee, C., et al., "Nonvolatile Memory With a Metal Nanocrystal/Nitride Heterogeneous Floating-Gate", *IEEE Trans. Electron Devices*, 52(12), (Dec. 2005), 2697-2702.
Raza, H., "A theoretical model for single-molecule incoherent scanning tunneling spectroscopy", Journal of Physics: Condensed Matter, 20(44), (2008), 6 pgs.

(Continued)

*Primary Examiner* — Elias M Ullah
(74) *Attorney, Agent, or Firm* — Schwegman Lundberg & Woessner, P.A.

(57) ABSTRACT

An electronic structure modulation transistor having two gates separated from a channel by corresponding dielectric layers, wherein the channel is formed of a material having an electronic structure that is modified by an electric field across the channel.

20 Claims, 9 Drawing Sheets

(56) References Cited

OTHER PUBLICATIONS

Raza, H., et al., "An atomistic quantum transport solver with dephasing for field-effect transistors", *Journal of Computational Electronics*, 7(3), (2008), 423-426.

Raza, H., et al., "Armchair graphene nanoribbons: Electronic structure and electric field modulation", *Phys. Rev. B.* 77, (2008), 245434-1-245434-5.

Raza, H., et al., "Incoherent transport through molecules on silcion in the vicinity of a dangling bond", *Phys. Rev. B.*, 77, (2008), 035432-1-035432-8.

Raza, H., et al., "On the Possibility of an Electronic-structure Modulation Transistor", *arXiv:0812.0123v2. Condensed Matter: Mesoscale and Nanoscale Physics.* [online]. Retrieved from the Internet: <URL: http://arxiv.org/PS_cache/arxiv/pdf/0812/0812.0123v2.pdf>, (2009), 4 pgs.

Raza, T. Z., et al., "Single-band tight-binding parameters for Fe—MgO—Fe magnetic heterostructures", *arXiv:0804.2557v5. Condensed Matter: Mesoscale and Nanoscale Physics.*[online]. Retrieved from the Internet: <URL: http://arxiv.org/PS_cache/arxiv/pdf/0804/0804.2557v5.pdf>, (2009), 7 pgs.

Sols, F., et al., "On the possibility of transistor action based on quanturm interference phenomena", *Applied Physics Letters*, 54(4), (1989), 350-352.

\* cited by examiner

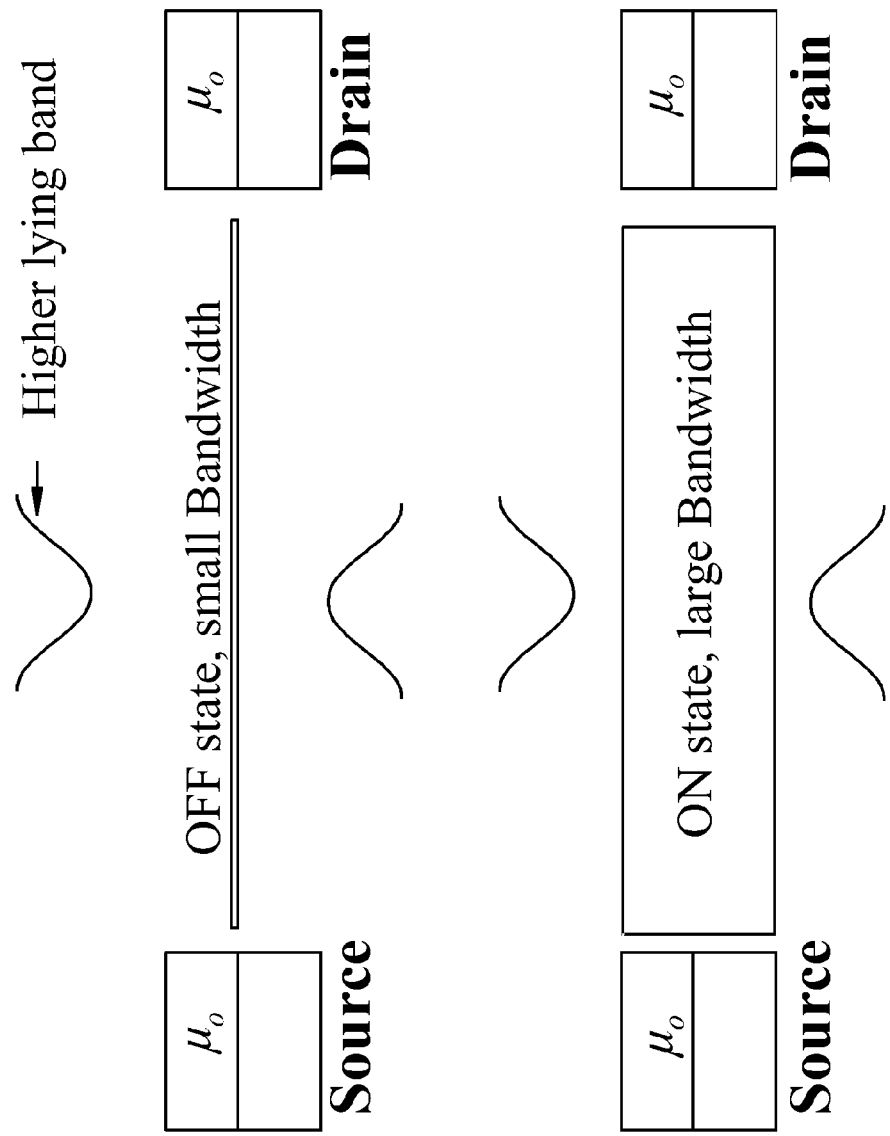

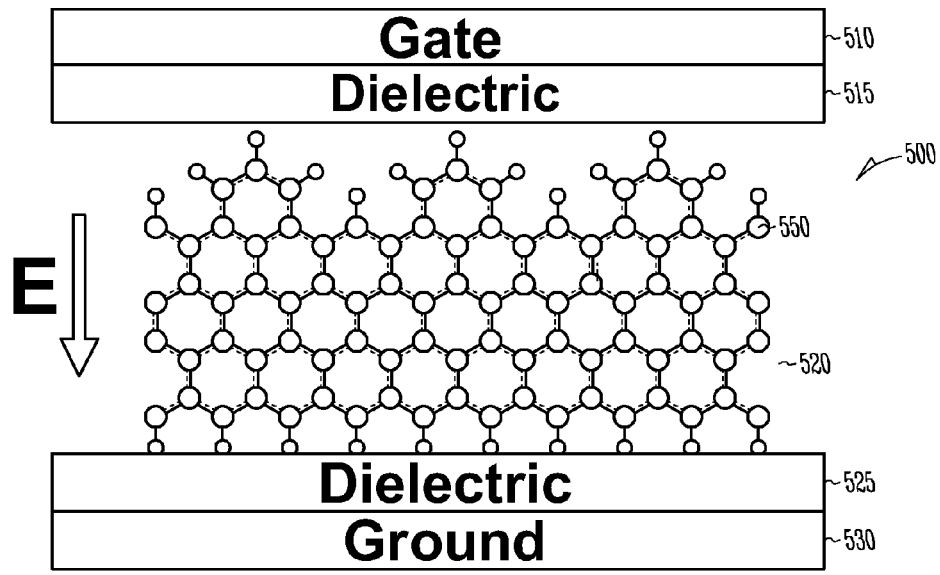
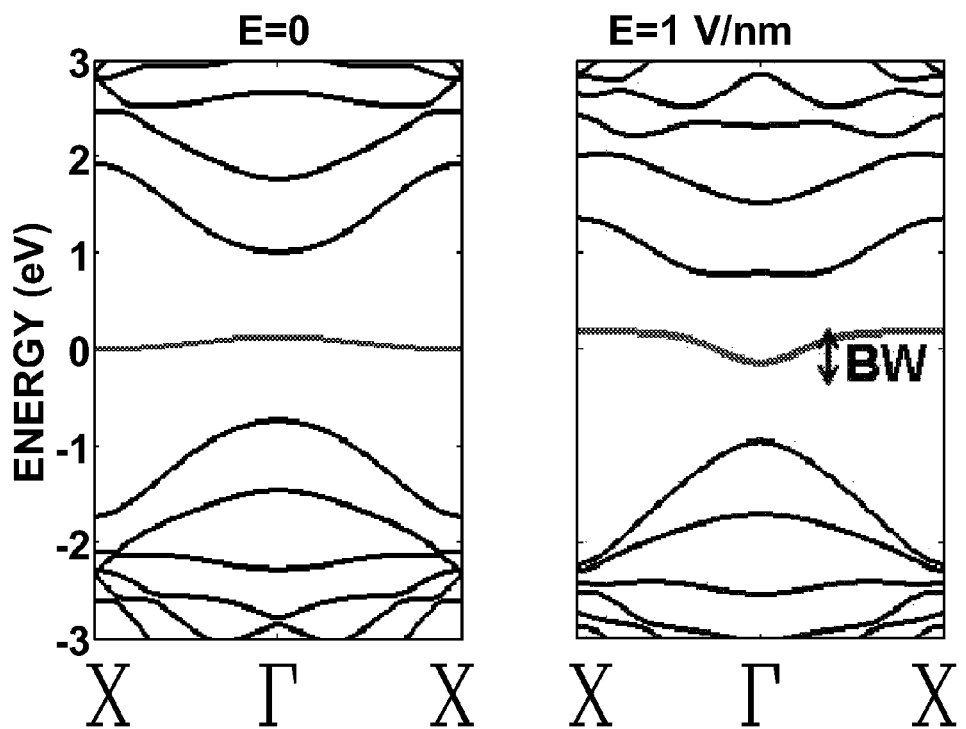
Fig.5

ELECTRONIC-STRUCTURE MODULATION TRANSISTOR

RELATED APPLICATION

This application claims priority to U.S. Provisional Application Ser. No. 61/154,678 (entitled ELECTRONIC-STRUCTURE MODULATION TRANSISTOR, filed Feb. 23, 2009) which is incorporated herein by reference.

GOVERNMENT FUNDING

This invention was made with Government support under Grant Number EEC-0646547 awarded by NSF. The United States Government has certain rights in the invention.

BACKGROUND

Common field effect transistors (FETs) utilize an insulated gate that creates a channel between a source and a drain. FETs rely on a band edge shift using an applied gate voltage to create the channel. Other types of transistors have also been explored. For example, velocity/mobility modulation transistors rely on the real-space transfer of carriers between two adjacent materials with different mobilities. Similarly, quantum modulation transistors (QMT) are based on the constructive and destructive interference of the wavefunctions in the channel by electrically changing the T-shaped box dimensions. Furthermore, quantum effects in various planar heterostructures based on the modulation-doped field-effect transistor (MODFET) principle have been explored, where the field-effect is used to perturb the barriers for carriers flowing between the source and the drain electrodes. The localization of the state near band edges due to disorder in the Anderson localization is also a relevant concept, which leads to a mobility edge, but this effect is limited by the thermal limit.

SUMMARY

An electronic structure modulation transistor having two gates separated from a channel by corresponding dielectric layers, wherein the channel is formed of a material having an electronic structure that is modified by an electric field across the channel.

BRIEF DESCRIPTION OF THE DRAWINGS

FIG. 3 is a representation of different bandwidths illustrating ON and OFF states of an electronic-structure modulation transistor according to an example embodiment.

FIG. 5 is a block cross section diagram of a portion of an electronic-structure modulation transistor according to an example embodiment for a graphene nanoribbon with armchair edges along with graphs illustrating energy distribution at different electric field strengths.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Electronic-structure modulation transistors (EMT) are described that utilize one, two or three dimensional channels. In contrast to the conventional field-effect transistor (FET) that rely on the band edge shift using an external gate voltage, in electronic-structure modulation transistors, the gate voltage modifies the band dispersion and hence modulates the bandwidth. In some embodiments, electronic-structure modulation transistors operate with a few kT of supply voltage with modulation of the bandwidth of a state accomplished by using an external gate voltage.

Such electronic-structure modulation of bandwidth may not only be achieved by changing the coupling between lattice sites, but also by taking advantage of the k-dependent and gate voltage dependent real-space localization of a state. In one example, an N=9 zigzag graphene nanoribbon is used to provide a channel exhibiting electronic-structure modulation of its bandwidth. In another example, an armchair graphene nanoribbon is used to provide a channel exhibiting electronic-structure modulation of its bandwidth.

Figure 1:
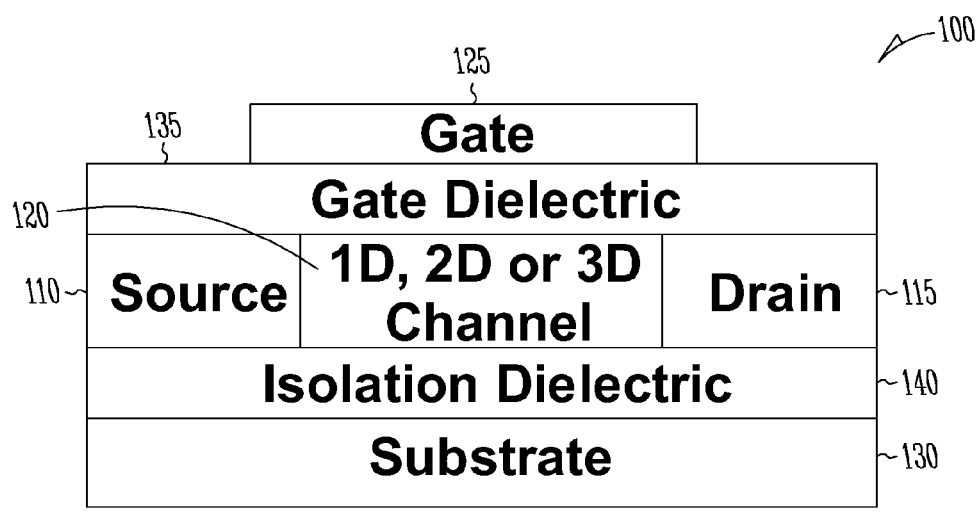
FIG. 1 is a block cross section diagram of an electronic-structure modulation transistor according to an example embodiment.

FIG. 1 is a block cross section diagram of an example electronic-structure modulation transistor 100. Electronic-structure modulation transistor 100 includes a source 110 and drain 115 separated by a channel 120. Two gates 125, 130 are positioned either side of the channel 120 and are separated from the channel by respective dielectric layers 135, 140. The gates 125, 130 may be referred to as top and bottom gates, left and right gates, or side gates depending on the orientation of the electronic-structure modulation transistor 100. The gates 125, 130 operate similar to capacitor plates, forming an electric field across channel 120 when a difference in voltage is applied to the gates. In various embodiments, the gates may be respectively coupled to different voltages, one or both of which are varied to modulate the electric field across the channel 120. One of the gates may be coupled to a ground.

In one embodiment, the gates are formed of metal, or highly doped semiconductor material such as silicon doped beyond degeneracy to provide high conductivity. If metal is used, it may be selected to be compatible with the material used for the dielectric layers 135, 140, which may be $SiO_2$, or other insulating material. Typical metals include chromium, gold, titanium and platinum. In one embodiment, the gates, dielectric layers and channel are formed in a vertical stack supported by a semiconductor substrate with insulating dielectric.

Figure 2A:
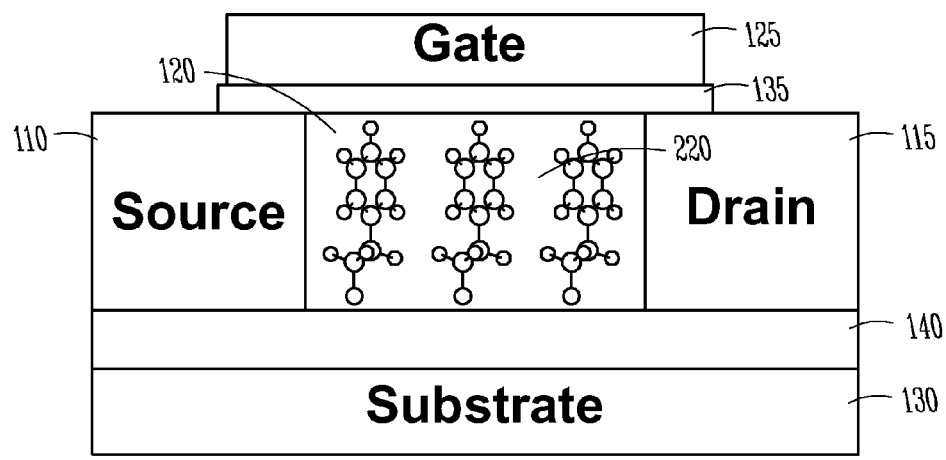
FIGS. 2A and 2B are block cross section diagrams of electronic-structure modulation transistors according to example embodiments, showing graphene nanostructures and organic molecules as the channel.
Figure 2B:
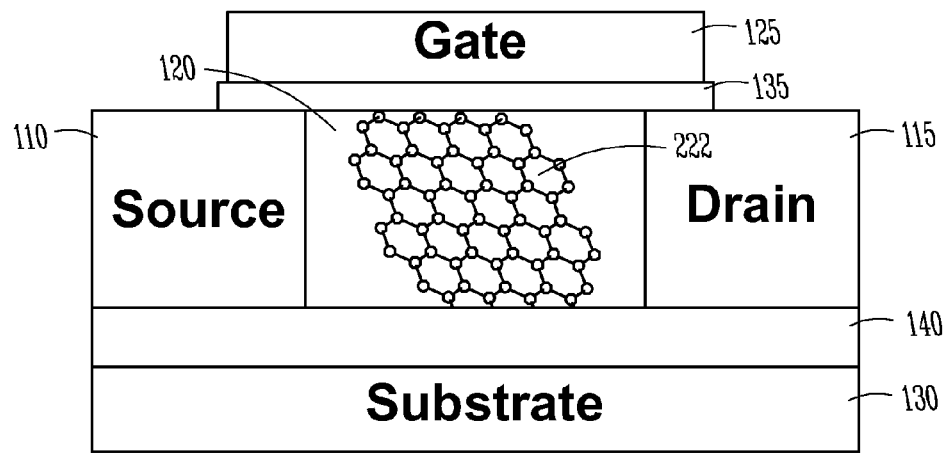

Various channel materials, such as molecule and graphene nanostructures may be used that exhibit an electronic structure change responsive to electric fields across them as shown in FIGS. 2A and 2B. Channel 120 be formed of one-dimensional, two-dimensional, and three-dimensional nanomaterials in various embodiments. In one embodiment, styrene molecules, such as styrene chains may be utilized as shown at channel 222 (see FIG. 2B). In further embodiment, graphene nanostructures, such as nanoribbons and disordered graphene may be used as shown at channel 220 (see FIG. 2A). Still further materials, such as multi-molecular wires, nanowires of various materials such as silicon, nanoribbons of various materials, organic molecules and C60 are among some of the materials which exhibit electronic structure modulation in an electric field. In one embodiment, the channel 120 is formed of nanowires of Si or other semiconducting materials where a near-midgap state can be modulated. As indicated in FIG. 1, various channel structures, such as a one, two, and three dimensional channel may be formed of suitable materials. In further embodiments, electronic-structure modulation transistors may be formed horizontally on a supporting substrate with insulating dielectric, with gates and dielectrics laterally positioned on either side of a channel.

Figure 2C:
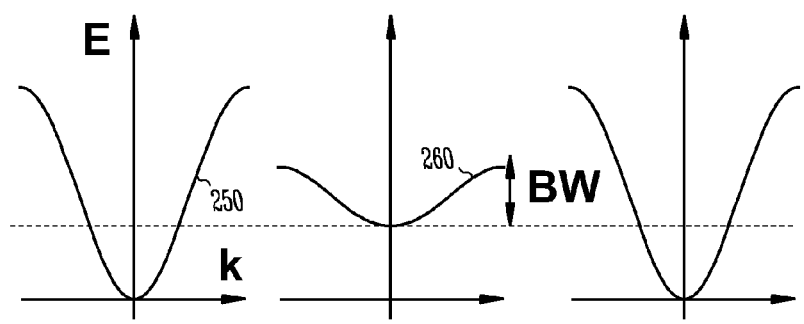
FIG. 2C shows graphs that illustrate the effect of an electric field on the bandwidth (BW) of a localized midgap or near-midgap state of a channel according to an example embodiment.

FIG. 2C includes graphs that illustrate the effect of an electric field 250 on bandwidth 260 of a localized midgap or near-midgap state of the channel, whereas the bandwidths of the source and drain contacts do not change. As the electric field increases, the bandwidth also increases, directly affecting the conductivity of the channel as shown in FIG. 3. The representations in FIG. 3 illustrate that small bandwidth (BW) will lead to small conduction between source and drain, which accounts for an OFF state. Large bandwidth (BW) results in higher conduction between source and drain, which results in ON state of the transistor. Tunnel through higher lying bands is small.

Figure 4:
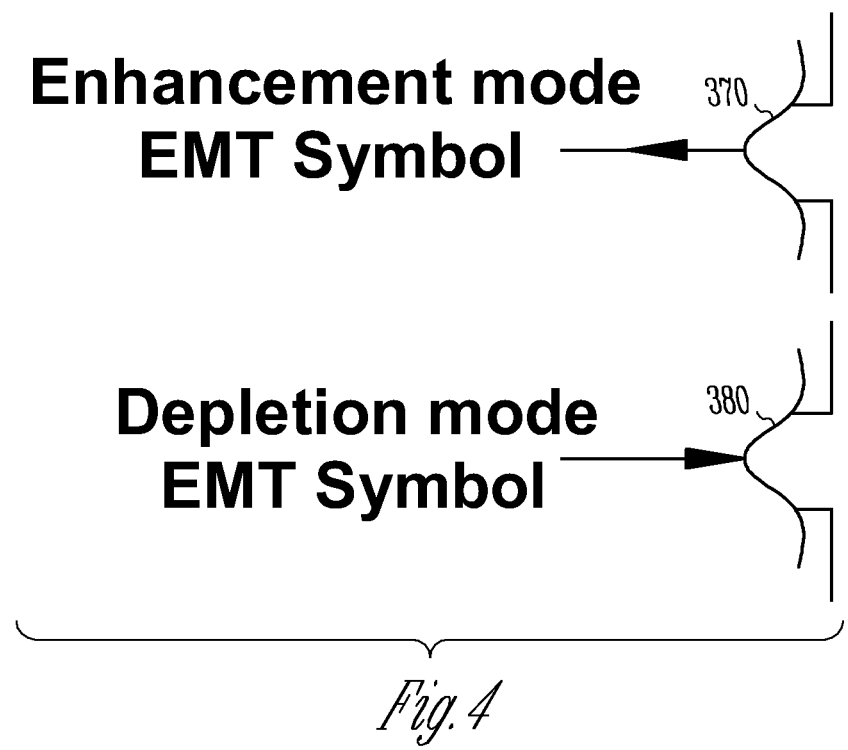
FIG. 4 illustrates enhancement and depletion mode symbols for an electronic-structure modulation transistor according to an example embodiment in enhancement mode and depletion mode operations.

In operation, a first voltage is applied across two gates having a channel disposed between the two gates to modify an electronic structure of the channel. A second voltage is applied across the two gates to modify the electronic structure of the channel differently than the modification of the electronic structure caused by the first voltage. The electronic-structure modulation transistor 100 may be operated in both enhancement mode and depletion mode as indicated by corresponding symbols 470, 480 in FIG. 4 by changing the voltages applied across the gates.

FIG. 5 is a block cross section diagram of a portion of an electronic-structure modulation transistor 500. For simplicity, the source and drain are not illustrated, but would be present on either side of the channel in various embodiments. Electronic-structure modulation transistor includes a top gate 510, top dielectric 515, channel 520, bottom dielectric 525 and a grounded gate 530. The channel in one embodiment is formed of a 1 nm wide armchair graphene nanoribbon 550 with disordered edges. The bandwidth of the midgap state is quite small without an electric-field. By applying an electric-field of 1V/nm, bandwidth can be increased to about 0.3 eV as illustrated in graphs below the transistor.

Figure 6:
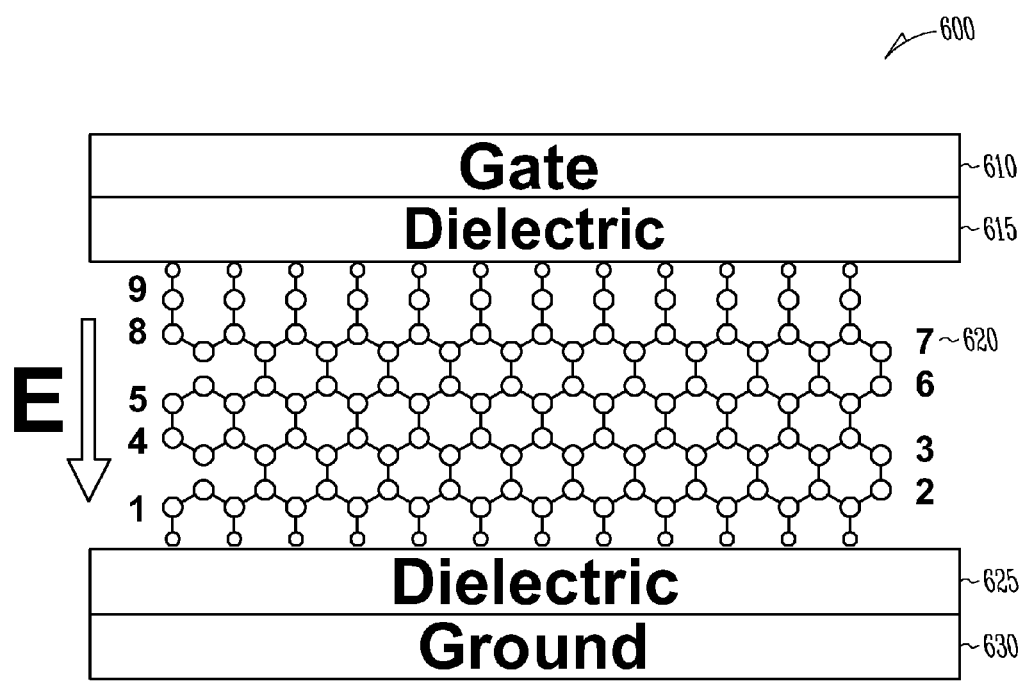
FIG. 6 is a block cross section diagram of a portion of an electronic-structure modulation transistor according to an example embodiment for a graphene nanoribbon with zigzag edges.

FIG. 6 is a block cross section diagram of a portion of an electronic-structure modulation transistor 600. For simplicity, the source and drain are not illustrated, but would be present on either side of the channel in various embodiments. Electronic-structure modulation transistor 600 includes a top gate 610, dielectric 615, channel 620, bottom dielectric 625 and a grounded gate 630. Channel 620 in one embodiment is formed of a N=9 zigzag graphene nanoribbon.

Figure 7:
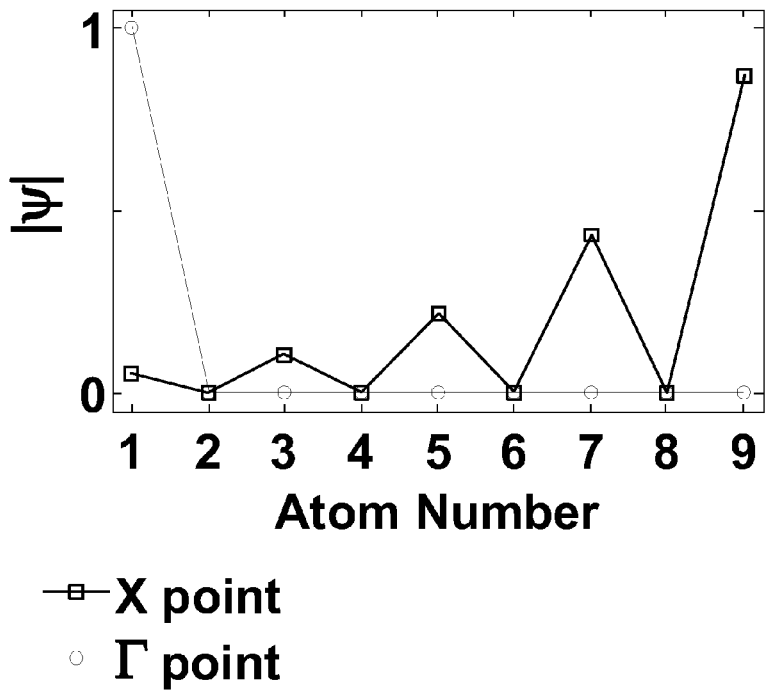
FIG. 7 is a graph illustrating atom number versus the absolute value of wavefunction $\psi$ for the channel of an electronic-structure modulation transistor according to an example embodiment.

FIG. 7 is a graph illustrating atom number versus the absolute value of wavefunction $\psi$ for the channel 620.

Figure 8:
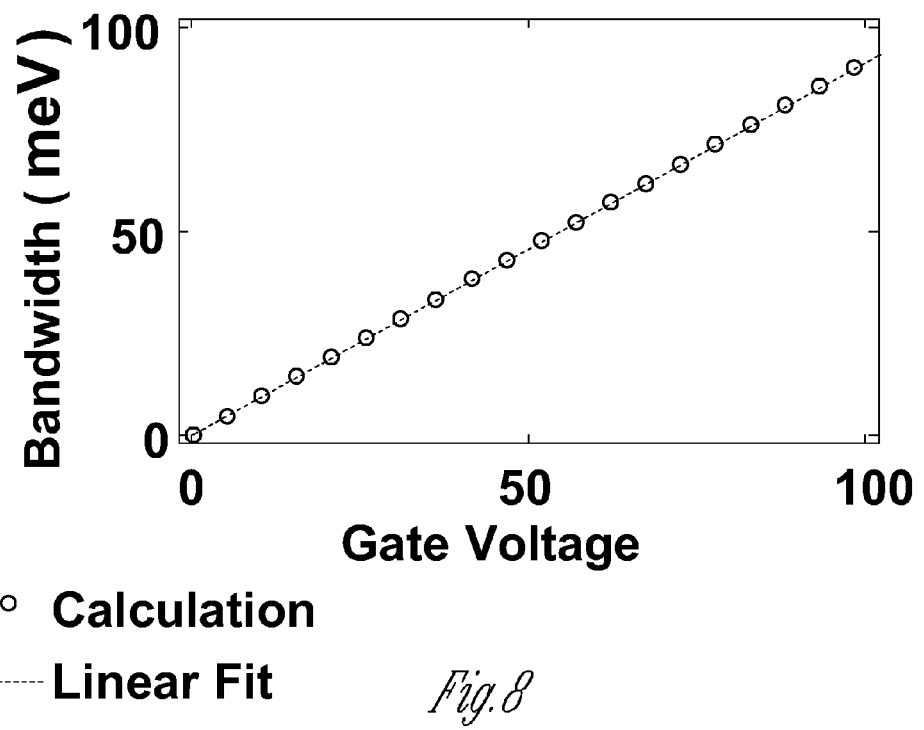
FIG. 8 illustrates the bandwidth of the channel in meV response to gate voltage differential in mV to create an electric-field inside the graphene. nanoribbon according to an example embodiment.

FIG. 8 illustrates the bandwidth of the channel in meV response to gate voltage differential in mV to create an electric-field inside the graphene.

Figure 9:
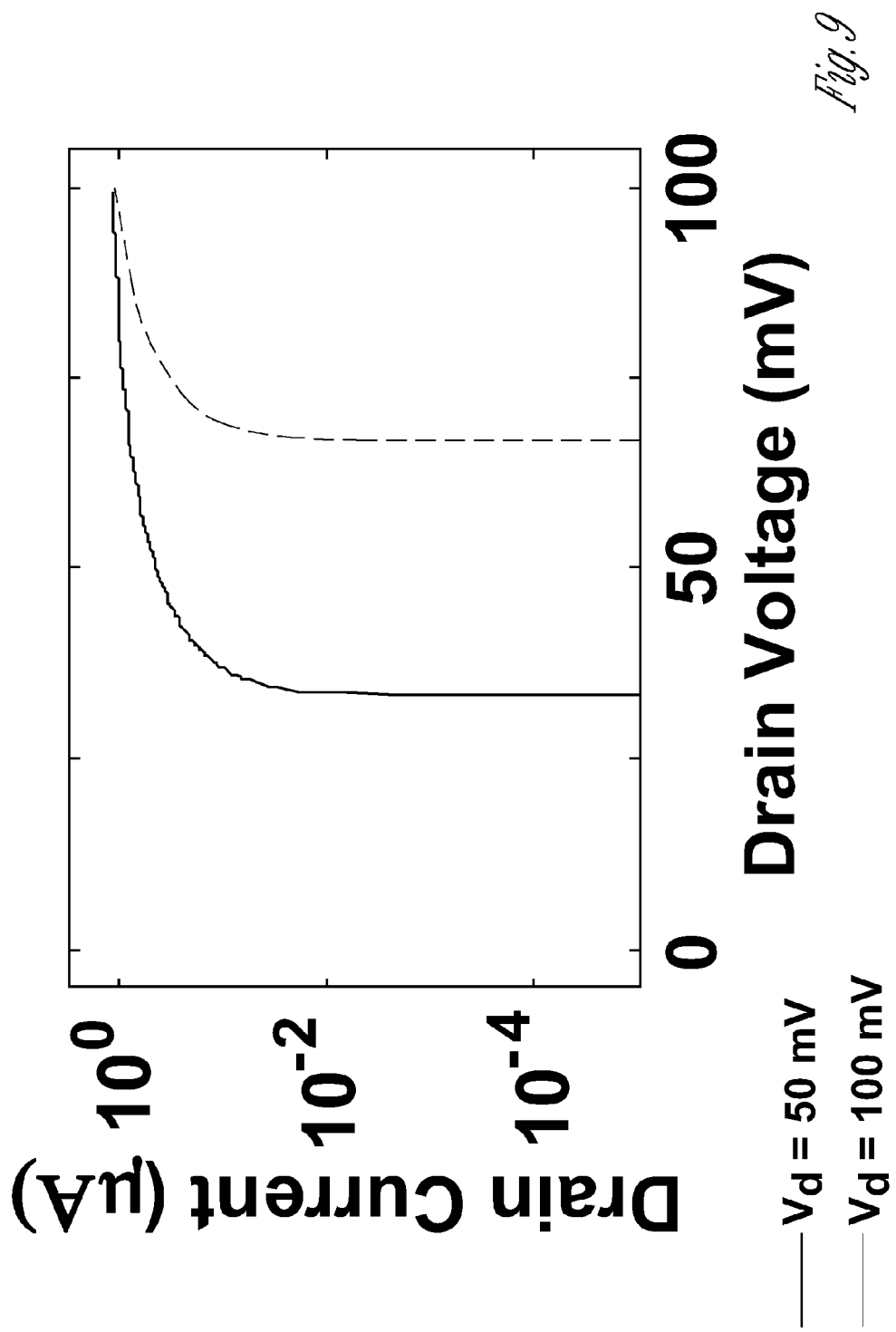
FIG. 9 shows the transfer characteristics (drain current versus gate voltage) of the transistor showing high ON/OFF ratio under small supply voltage requirements for various drain voltages.

FIG. 9 shows the transfer characteristics (drain current versus gate voltage) for various drain voltages. Very high ON/OFF current ratios are observed with small gate voltage change—thus satisfying the small supply voltage goal.

Figure 10:
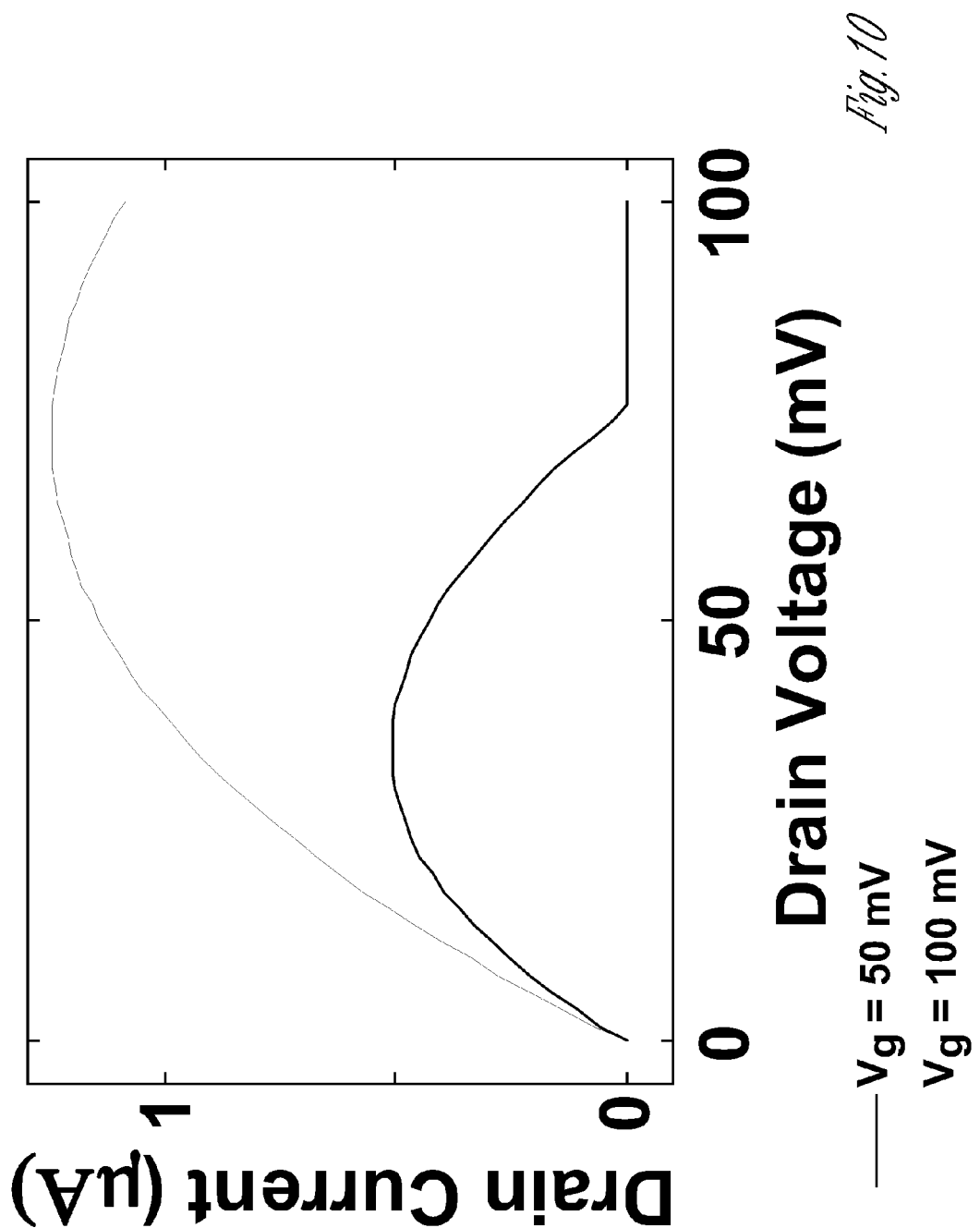
FIG. 10 shows the output characteristics (drain current versus drain voltage) of the transistor showing negative differential resistance feature under small supply voltage.

FIG. 10 shows the output characteristics (drain current versus drain voltage) for various gate voltages. A negative differential resistance feature is observed. Thus the output resistance depends on the load line in a way that the output resistance can be very high if operated around the inflection point. Such high output resistance of the electronic-structure modulation transistor can lead to gain, which is an important requirement for use of transistors in logic operations.

In various embodiments, electronic modulation transistors may exhibit gain, low power consumption such as a $V_{DD}$ of a few kT, and scaling beyond 10 nm. In various embodiments, electronic modulation transistors may exhibit gain, low power consumption such as a $V_{DD}$ or a few kT, scaling beyond 10 nm and pico-second operation due to all-electronic operation. Pico-second operation facilitates nanosecond operation at a circuit level consistent with GHz processor speed.

Graphene Nanoribbon Transistor Fabrication:

The fabrication of zigzag and armchair graphene nanoribbon transistors in side-gated geometry having imperfect edges with either metallic contacts or graphene contacts is now described. Wafer-scale graphene films may be grown using chemical vapor deposition with methane gas on nickel substrate at 1000° C. and subsequent transfer on a silicon substrate with 300 nm thermal oxide for contrast imaging to optically determine the number of layers. In a further method, graphene grown on SiC substrate may be transferred and used. Spatially-resolved Raman characterization may be further performed. A raster scan of 1 μm spatial resolution may be used to ensure determination of the number of layers on micron scale of lateral resolution. Although a single layer is utilized in one embodiment, multilayer graphene nanoribbons may also show similar behavior due to multiple weakly coupled conduction channels.

After material characterization, electron beam lithography may be performed using a bi-layer PMMA (Polymethylmethacrylate (Acrylic)) process to achieve 20 nm features with about 20 nm stitching accuracy. Over-etching (plasma) may be used to obtain few nm wide nanoribbons. A second step of electron beam lithography may be used to define features in side gates of about 30 nm separation (so that gate dielectric thickness is about 15 nm) with the nanoribbon of few-nm width in the middle and source drain contacts (either graphene or metallic contacts) separated by few tens of nm to 1 μm length scales for characterization of channel length.

Contact pads that are 1 μm sized may be fabricated using photolithography and matched with features on nm scale using alignment marks. Gate dielectric may be deposited using atomic layer deposition. $HfO_2$ or other material may be used for high-K gate stack formation, which will help achieve an effective-oxide-thickness of about 2-3 nm. Finally, an etch through the oxide may be performed for making contact with source, drain and gate electrodes.

Molecular Transistor Fabrication:

The fabrication of transistors having molecular wires of styrene or other organic molecules with a channel defined either by break junction (to obtain sub 10 nm feature size) or electron beam lithography (to obtain 20 nm feature size) on undoped silicon substrate is now described. Once the channel is lithographically defined, styrene or other organic molecules may be deposited by a well-established 2D self-assembly technique through cyclo-addition on Si(100) surface, which will form 1D wires in parallel with a spacing of about 7.68 Å. A top gate dielectric may be deposited first by gentle physical vapor deposition of 2 nm $SiO_2$ and then atomic layer deposition of 10 nm $HfO_2$ or other high-k dielectric material to have an equivalent-oxide-thickness of about 4 nm. Top gate photolithography and contact opening is performed to have the final device structure with molecules in a 20 nm gap. Similar process flow may be carried out for break-junctions, where the electron beam lithography would be replaced by an electrical break junction formation method.

Working principles as they are currently understood are now described by use of formulas. No representation is made as to the correctness of the principles described, and they are presented merely to supplement the above description of the EMT.

$BW=\text{Mag}(\alpha|eV_g|+BW_0)$; ansatz

α=Modulation factor (dimensionless)
α≈0.9 and $BW_0$ is zero for the zzGNR $BW=|4t_0|$ $t_0=\pm\alpha|eV_g|/4+BW_0/4$

\

$T_{non-equilibrium}(E)$ is calculated from NEGF.

$$I = \frac{2e}{h} \int dE \cdot T(E)[f_1(E) - f_2(E)]$$

The Abstract is provided to comply with 37 C.F.R. §1.72(b) is submitted with the understanding that it will not be used to interpret or limit the scope or meaning of the claims.

The invention claimed is:

1. An electronic structure modulation transistor having two gates separated from a channel by corresponding dielectric layers, wherein the channel includes graphene nanoribbon with imperfect edges and forms an electronic structure that has a near-midgap state, wherein a band width of the near-midgap state of the channel is modifiable by an electric field across the channel.

2. The transistor of claim 1 wherein the band width of the near midgap state of the channel is modulated by the electric field.

3. The transistor of claim 1 wherein the channel is formed of zigzag graphene nanoribbon.

4. The transistor of claim 1 wherein the channel is formed of molecular nano structures.

5. The transistor of claim 1 wherein the channel includes nanowires of Si or other semiconducting materials where a near-midgap state can be modulated.

6. The transistor of claim 1 wherein the gates are formed of conductively doped silicon.

7. The transistor of claim 1 wherein the gates are formed of conductive metal.

8. The transistor of claim 1 wherein the gates, dielectric layers and channel are formed in a vertical stack supported by a semiconductor substrate with insulating dielectric.

9. The transistor of claim 1 wherein the gates, dielectric layers and channel are formed in a horizontal arrangement supported by a semiconductor substrate with insulating dielectric.

10. The transistor of claim 1 wherein the electronic structure of the channel is modulated by a voltage applied across the gates.

11. The transistor of claim 1 wherein the channel is formed of armchair graphene nanoribbon.

12. An electronic structure modulation transistor having two gates separated from a channel by corresponding dielectric layers, wherein the channel includes styrene chains or other molecular chains and forms an electronic structure that has a near-midgap state, wherein a band width of the near-midgap state of the channel is modifiable by an electric field across the channel.

13. A transistor comprising:
   a pair of gates having adjacent dielectric layers;
   a channel disposed between the adjacent dielectric layers, wherein the channel includes graphene nanoribbon with imperfect edges and forms an electronic structure that has a near-midgap state, wherein a band width of the near-midgap state of the channel is modifiable by an electric field provided from a voltage applied across the pair of gates.

14. The transistor of claim 13 wherein the bandwidth of the near-midgap state of the channel is modulated by the electric field.

15. The transistor of claim 13 wherein the channel is formed of zigzag graphene nanoribbon.

16. The transistor of claim 13 wherein the channel is formed of molecular nano structures.

17. The transistor of claim 13 wherein the channel is formed of nanowires of Si or other semiconducting materials where a near-midgap state can be modulated.

18. The transistor of claim 13 wherein the gates are formed of conductively doped silicon.

19. The transistor of claim 13 wherein the channel is formed of armchair graphene nanoribbon.

20. A transistor comprising:
   a pair of gates having adjacent dielectric layers;
   a channel disposed between the adjacent dielectric layers, wherein the channel includes styrene chains or other molecular chains and forms an electronic structure that has a near-midgap state, wherein a band width of the near-midgap state is modifiable by an electric field provided from a voltage applied across the pair of gates.

* * * * *

UNITED STATES PATENT AND TRADEMARK OFFICE
CERTIFICATE OF CORRECTION

| | |
|---|---|
| PATENT NO. | : 8,841,650 B2 |
| APPLICATION NO. | : 12/711007 |
| DATED | : September 23, 2014 |
| INVENTOR(S) | : Hassan Raza |

It is certified that error appears in the above-identified patent and that said Letters Patent is hereby corrected as shown below:

In the References Cited

On page 2, in column 2, under "Other Publications", line 12, delete "quanturm" and insert --quantum--, therefor In the Claims In column 5, line 57, in Claim 2, delete "near midgap" and insert --near-midgap--, therefor In column 6, line 2, in Claim 4, delete "nano structures" and insert --nanostructures--, therefor In column 6, line 44, in Claim 16, delete "nano structures" and insert --nanostructures--, therefor Signed and Sealed this
Third Day of November, 2015

Michelle K. Lee
*Director of the United States Patent and Trademark Office*